(12) United States Patent
Hu et al.

(10) Patent No.: US 10,964,776 B2
(45) Date of Patent: Mar. 30, 2021

(54) PIXEL DEFINING STRUCTURE, DISPLAY PANEL, METHOD OF MANUFACTURING THE SAME AND DISPLAY DEVICE

(71) Applicant: BOE TECHNOLOGY GROUP CO., LTD., Beijing (CN)

(72) Inventors: Chunjing Hu, Beijing (CN); Wenjun Hou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 47 days.

(21) Appl. No.: 16/497,585

(22) PCT Filed: Apr. 29, 2019

(86) PCT No.: PCT/CN2019/084929
§ 371 (c)(1),
(2) Date: Sep. 25, 2019

(87) PCT Pub. No.: WO2020/042656
PCT Pub. Date: Mar. 5, 2020

(65) Prior Publication Data
US 2020/0403060 A1    Dec. 24, 2020

(30) Foreign Application Priority Data
Aug. 31, 2018    (CN) .......................... 201811010429.3

(51) Int. Cl.
*H01L 27/32*    (2006.01)
*H01L 51/56*    (2006.01)

(52) U.S. Cl.
CPC ...... *H01L 27/3283* (2013.01); *H01L 27/3246* (2013.01); *H01L 51/56* (2013.01)

(58) Field of Classification Search
CPC .. H01L 27/3246; H01L 27/3283; H01L 51/56
See application file for complete search history.

(56) References Cited

U.S. PATENT DOCUMENTS

2014/0329056 A1*  11/2014  Hou .................... H01L 51/0003
                                                      428/195.1
2019/0206955 A1*   7/2019  Paek ..................... H01L 27/326

FOREIGN PATENT DOCUMENTS

| CN | 107248523 A | 10/2017 |
| CN | 107731871 A | 2/2018 |
| JP | 2013-092701 A | 5/2013 |

* cited by examiner

*Primary Examiner* — Allan R Wilson
(74) *Attorney, Agent, or Firm* — The Webb Law Firm (57) ABSTRACT

This disclosure relates to a pixel defining structure, a display panel, a method of manufacturing the same, and a display device. The pixel defining structure includes: a first pixel defining layer with a first opening, located on a substrate, wherein the first pixel defining layer includes a first portion formed by a first hydrophilic-hydrophobic material and a second portion formed by a second hydrophilic-hydrophobic material, projections of the first portion and the second portion on a surface of the substrate are substantially not overlapped, a side surface of the first pixel defining layer facing the first opening includes a first side surface formed by the first hydrophilic-hydrophobic material and a second side surface formed by the second hydrophilic-hydrophobic material, and the first hydrophilic-hydrophobic material has a different hydrophilicity and hydrophobicity from that of the second hydrophilic-hydrophobic material.

20 Claims, 9 Drawing Sheets

PIXEL DEFINING STRUCTURE, DISPLAY PANEL, METHOD OF MANUFACTURING THE SAME AND DISPLAY DEVICE

CROSS-REFERENCE TO RELATED APPLICATIONS

The present application is a U.S. National Stage Application under 35 U.S.C. § 371 of International Patent Application No. PCT/CN2019/084929, filed on Apr. 29, 2019, which is based on and claims priority to China Patent Application No. 201811010429.3, filed on Aug. 31, 2018, the disclosure of both of which are incorporated by reference hereby in entirety into the present application.

TECHNICAL FIELD

This disclosure relates to the technical field of display, and in particular, to a pixel defining structure, a display panel, a method of manufacturing the same, and a display device.

BACKGROUND

With the rapid development of display technologies, people have higher and higher requirements on performance of display products. Display panel, as an important component of display products, has received extensive attentions.

In a process of manufacturing the display panel, particularly in a process of manufacturing a functional layer thin film by using a wet process such as inkjet printing, it is necessary to remove excess solvent by a drying process. The drying process will result in uneven thickness of the formed thin film, thereby affecting the lifetime and display effect of a display device.

Related wet manufacturing processes employ a two-layer Pixel Defining Layer (PDL) structure to reduce unevenness of the thickness of the thin film caused by the drying process.

SUMMARY

According to a first aspect of the embodiments of this disclosure, a pixel defining structure is provided, comprising: a first pixel defining layer with a first opening, located on a substrate, wherein the first pixel defining layer comprises a first portion formed by a first hydrophilic-hydrophobic material and a second portion formed by a second hydrophilic-hydrophobic material, projections of the first portion and the second portion on a surface of the substrate are substantially not overlapped, a side surface of the first pixel defining layer facing the first opening comprises a first side surface formed by the first hydrophilic-hydrophobic material and a second side surface formed by the second hydrophilic-hydrophobic material, and the first hydrophilic-hydrophobic material and the second hydrophilic-hydrophobic material are of different hydrophilicity-hydrophobicity.

In some embodiments, the first portion is a lyophilic portion, the second portion is a lyophobic portion, a side of the lyophilic portion close to the first opening comprises a tooth-shaped structure, the lyophobic portion is located between teeth of the tooth-shaped structure, and the lyophobic portion does not extend beyond the lyophilic portion in an extending direction of the teeth.

In some embodiments, the tooth-shaped structure is a rectangular tooth-shaped structure, and in the rectangular tooth structure, a projection of the first side surface on the substrate is approximately "∩" shaped, and a projection of the second side surface on the substrate is approximately "|" shaped.

In some embodiments, the pixel defining structure further comprises: a second pixel defining layer with a second opening, located on a side of the first pixel defining layer away from the substrate, wherein the second pixel defining layer is formed by the second hydrophilic-hydrophobic material, a projection of the second pixel defining layer on the surface of the substrate is completely covered by the projection of the first pixel defining layer on the surface of the substrate, the second opening is located correspondingly to the first opening, and a projection of the second opening on the surface of the substrate completely covers a projection of the first opening on the surface of the substrate.

In some embodiments, the first hydrophilic-hydrophobic material comprises $SiO_2$.

In some embodiments, the second hydrophilic-hydrophobic material comprises a fluorolipid material.

In some embodiments, a slope angle of the side surface facing the first opening is in a range of 30 degrees to 90 degrees.

In some embodiments, the first pixel defining layer is a mesh structure having a plurality of first openings, and all side surfaces of the first pixel defining layer facing the first openings include a first side surface formed by the first hydrophilic-hydrophobic material and a second side surface formed by the second hydrophilic-hydrophobic material.

In some embodiments, the first portion and the second portion in the first pixel defining layer have the same height.

In some embodiments, the second hydrophilic-hydrophobic material in the second portion of the first pixel defining layer and in the second pixel defining layer are integral, and the second hydrophilic-hydrophobic material is a lyophobic material.

In some embodiments, the first pixel defining layer comprises a main body portion and a tooth-shaped structure, and a projection of the second pixel defining layer on the substrate completely falls into the projection of the main body portion of the first pixel defining layer.

In some embodiments, a slope angle of the side surface of the second pixel defining layer facing the second opening is in a range of 30 degrees to 90 degrees.

In some embodiments, the first side surface and the second side surface are arranged alternately and are respectively arranged on a convex portion and a concave portion of the rectangular tooth structure.

In some embodiments, a projection of the lyophobic portion on the substrate is approximately rectangular, and a portion of the lyophilic portion, which exceeds beyond the lyophobic portion in a direction towards the first opening, is approximately rectangular.

In some embodiments, the first pixel defining layer comprises a main body portion and a tooth-shaped structure, and a density of teeth of the tooth-shaped structure in the same direction is substantially the same.

According to a second aspect of the embodiments of this disclosure, a display panel comprising the aforementioned pixel defining structure is provided.

According to a third aspect of the embodiments of this disclosure, a display device comprising the aforementioned display panel is provided.

According to a fourth aspect of the embodiments of this disclosure, a method of manufacturing a pixel defining structure is provided, comprising: forming a first pixel defining layer with a first opening on a substrate, wherein the first pixel defining layer comprises a first portion formed by a first hydrophilic-hydrophobic material and a second portion formed by a second hydrophilic-hydrophobic material, projections of the first portion and the second portion on a surface of the substrate are substantially not overlapped, a side surface of the first pixel defining layer facing the first opening comprises a first side surface formed by the first hydrophilic-hydrophobic material and a second side surface formed by the second hydrophilic-hydrophobic material, and the first hydrophilic-hydrophobic material and the second hydrophilic-hydrophobic material are of different hydrophilicity-hydrophobicity.

In some embodiments, the method further comprises: forming a second pixel defining layer on the first pixel defining layer, wherein forming the first pixel defining layer and the second pixel defining layer comprises: forming a first hydrophilic-hydrophobic material layer on the substrate; patterning the first hydrophilic-hydrophobic material layer to form the first portion of the first pixel defining layer; forming a second hydrophilic-hydrophobic material layer on the basis of the patterned first hydrophilic-hydrophobic material layer; patterning the second hydrophilic-hydrophobic material layer to form the second portion of the first pixel defining layer and the second pixel defining layer, wherein the second pixel defining layer has a second opening, a projection of the second pixel defining layer on a surface of the substrate is completely covered by a projection of the first pixel defining layer on the surface of the substrate, the second opening is located corresponding to the first opening, and a projection of the second opening on the surface of the substrate completely covers a projection of the first opening on the surface of the substrate.

In some embodiments, the first portion is a lyophilic portion, and the method further comprising: determining an area ratio of the first side surface to the second side surface according to a climbing speed of a functional layer to be formed at the first opening in the lyophilic portion.

In some embodiments, the area ratio of the first side surface to the second side surface is inversely proportional to the climbing speed.

According to a fifth aspect of the embodiments of this disclosure, a method of manufacturing a display panel is provided, comprising: the method of manufacturing the pixel defining structure.

In some embodiments, the pixel defining structure outlines an opening for forming the functional layer, the opening comprising a first opening, and the method further comprising: forming a solution containing a material of the functional layer in the opening by using inkjet printing.

Other features of this disclosure and advantages thereof will become apparent from the following detailed description of the embodiments of this disclosure with reference to the accompanying drawings.

BRIEF DESCRIPTION OF THE DRAWINGS

The accompanying drawings, which are incorporated in and constitute a part of this specification, illustrate embodiments of this disclosure and together with the description, serve to explain the principles of the disclosure.

This disclosure will be more clearly understood from the detailed description below with reference to the accompanying drawings, wherein.

It should be understood that the dimensions of the various portions illustrated in the drawings are not drawn to scale. Further, the same or similar reference numerals denote the same or similar members.

DETAILED DESCRIPTION

Various embodiments of this disclosure will now be described in detail with reference to the accompanying drawings. The description of the embodiments is merely illustrative and is in no way intended to limit the disclosure, its application, or uses. This disclosure may be embodied in many different forms and is not limited to the embodiments described herein. These embodiments are provided so that this disclosure will be thorough and complete, and will fully convey the scope of the disclosure to those skilled in the art. It should be noted that: unless specifically stated otherwise, the relative arrangement of the parts and steps set forth in these embodiments is to be construed as illustrative only and not as restrictive.

The use of terms "first," "second," and the like in this disclosure does not denote any order, quantity, or importance, but rather distinguish one element from another. The word "comprising" or the like means that an element before the word covers elements after the word, and does not exclude the possibility of covering other elements. "upper", "lower", "left", "right", etc. are used only to indicate relative position relations, which may also change accordingly when an absolute position of the described object changes.

In this disclosure, when it is described that a specific element is located between a first element and a second element, an intervening element may or may not be present between the specific element and the first element or the second element.

All terms (including technical or scientific terms) used in this disclosure have the same meanings as commonly understood by one of ordinary skill in the art to which this disclosure belongs, unless otherwise specifically defined. It will be further understood that terms, such as those defined in commonly used dictionaries, should be interpreted as having meanings that are consistent with their meanings in the context of the relevant art and will not be interpreted in an idealized or overly formal sense unless expressly so defined herein.

Techniques, methods, and apparatuses known to those of ordinary skill in the relevant art may not be discussed in detail, but are to be considered as a part of the specification where appropriate.

It is still hard to ensure even thickness of the thin film formed by the related wet manufacturing process.

For this reason, this disclosure proposes a technical solution capable of improving evenness of the thickness of the thin film manufactured by a wet process.

According to some embodiments of this disclosure, a pixel defining structure comprises: a first pixel defining layer with a first opening. The first pixel defining layer is located on a substrate. The first pixel defining layer comprises a first portion formed by a first hydrophilic-hydrophobic material and a second portion formed by a second hydrophilic-hydrophobic material. Projections of the first portion and the second portion on a surface of the substrate are substantially not overlapped. A side surface of the first pixel defining layer facing the first opening comprises a first side surface formed by the first hydrophilic-hydrophobic material and a second side surface formed by the second hydrophilic-hydrophobic material. The first hydrophilic-hydrophobic material has a different hydrophilicity and hydrophobicity from that of the second hydrophilic-hydrophobic material. As used herein, the phrasing "A and B are substantially not overlapped" comprises a case that materials of A and B are mixed in a small range due to a manufacturing error or the like.

According to some other embodiments of this disclosure, the pixel defining structure further comprises: a second pixel defining layer with a second opening. The second pixel defining layer is located on a side of the first pixel defining layer away from the substrate, and is formed by the second hydrophilic-hydrophobic material. A projection of the second pixel defining layer on the surface of the substrate is completely covered by the projection of the first pixel defining layer on the surface of the substrate, the second opening is located corresponding to the first opening, and a projection of the second opening on the surface of the substrate completely covers a projection of the first opening on the surface of the substrate.

Figure 1:
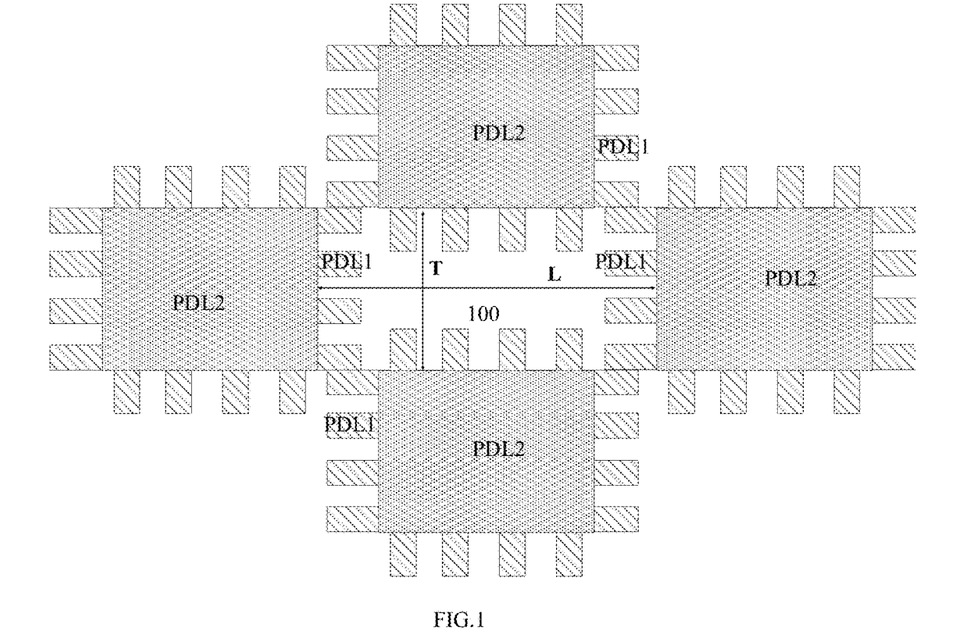
FIG. 1 is a top view illustrating a pixel defining structure according to an embodiment of this disclosure.

FIG. 1 is a top view illustrating a pixel defining structure according to an embodiment of this disclosure.

FIG. 1 shows the distribution of the first pixel defining layer PDL1, the second pixel defining layer PDL 2 in the longitudinal direction L and the transverse direction T on the substrate 100.

Figure 1A:
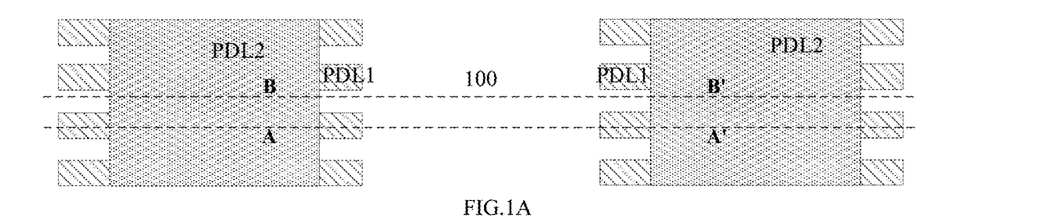
FIG. 1A is a top view of a portion of the pixel defining structure shown in FIG. 1.
Figure 1B:
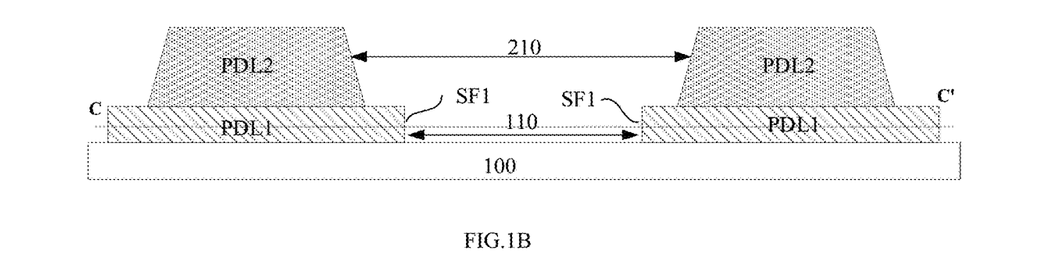
FIGS. 1B and 1C are cross-sectional views of the pixel defining structure taken along lines AA 'and BB', respectively, in the top view shown in FIG. 1A.
Figure 1C:
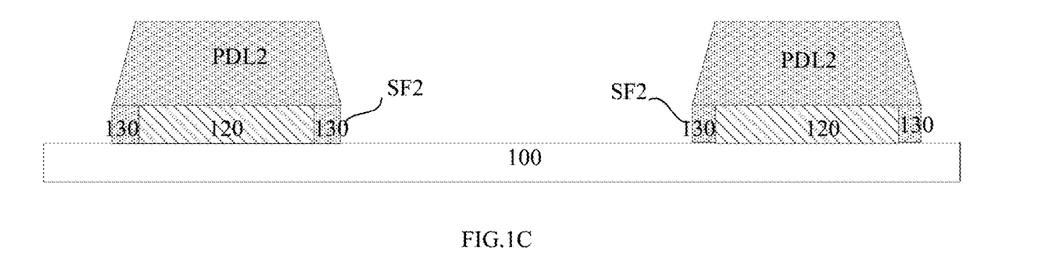
Figure 1D:
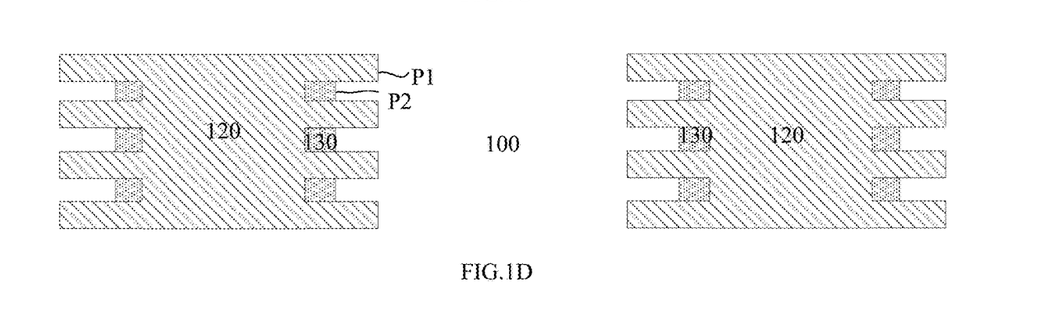
FIG. 1D is a cross-sectional view of the pixel defining structure taken along a line CC' in the cross-sectional view shown in FIG. 1B.

FIG. 1A is a top view of a portion (including two pixel defining units) of the pixel defining structure shown in FIG. 1. FIGS. 1B and 1C are cross-sectional views of the pixel defining structure taken along lines AA 'and BB' in FIG. 1A, respectively. FIG. 1D is a cross-sectional view of the pixel definition structure taken along a line CC' in FIG. 1B.

FIG. 1A shows the distribution of the first pixel defining layer PDL1 and the second pixel defining layer PDL2 in the longitudinal direction L on the substrate 100. As shown in FIG. 1B, the first pixel defining layer PDL 1 has a first opening 110, and the second pixel defining layer PDL 2 has a second opening 210. The second opening 210 is located correspondingly to the first opening 110, and the projection of the second opening 210 on the surface of the substrate completely covers the projection of the first opening 110 on the surface of substrate. For example, the position of the second opening 210 corresponds to the position of the first opening 110 and their centers substantially overlap with each other, and the second opening 210 is larger than the first opening 110.

The side surface of the first pixel defining layer PDL1 facing the first opening 110 comprises a first side surface SF1 and a second side surface SF2, as shown in FIGS. 1B and 1C, respectively. Projections P1 and P2 of the first side surface SF1 and the second side surface SF2 on the surface of the substrate 100 do not have an intersection line, as shown in FIG. 1D. The first side surface SF1 is formed by a first hydrophilic-hydrophobic material (e.g., a lyophilic material), and the second side SF2 is formed by a second hydrophilic-hydrophobic material (e.g., a lyophobic material). In some embodiments, the lyophilic material comprises $SiO_2$ and the lyophobic material comprises a fluorolipid material.

As shown in FIGS. 1B and 1C, the first pixel defining layer PDL1 is located on the substrate 100. The projection of the second pixel defining layer PDL2 on the surface of the substrate is completely covered by the projection of the first pixel defining layer PDL1 on the surface of the substrate. For example, the second pixel definition layer PDL2 partially covers the first pixel definition layer PDL1.

As shown in FIG. 1C, the first pixel defining layer PDL1 comprises a first portion (e.g., lyophilic portion) 120 formed by the first hydrophilic-hydrophobic material and a second portion (e.g., lyophobic portion) 130 formed by the second hydrophilic-hydrophobic material. In some embodiments, the first portion 120 and the second portion 130 are of the same height. As shown in FIG. 1D, the projections of the first portion 120 and the second portion 130 on the surface of the substrate do not overlap.

As shown in FIG. 1C, the first pixel defining layer comprises a main body portion and a tooth-shaped structure, and a projection of the second pixel defining layer on the substrate completely falls into the projection of the main body portion of the first pixel defining layer.

The second pixel defining layer is approximately rectangular.

The second pixel defining layer PDL2 is formed by the second hydrophilic-hydrophobic material, for example, the same kind of second hydrophilic-hydrophobic material as PDL1. In some embodiments, the second hydrophilic-hydrophobic material in the second pixel defining layer PDL2 is integral with the second hydrophilic-hydrophobic material in the second portion 130 of the first pixel defining layer PDL1, e.g., both lyophobic materials. The PDL2 is formed by a lyophobic material or includes a lyophobic material on the surface thereof, which can prevent overflow from occurring during the process of preparing the functional layer using a wet process, thereby effectively preventing color mixing between adjacent pixels.

FIG. 1D shows a cross-sectional view of the first pixel defining layer PDL1 taken along a line CC' in the cross-sectional view shown in FIG. 1B. The first portion 120 is a lyophilic portion and the second portion 130 is a lyophobic portion. The lyophilic section 120 comprises a tooth-shaped structure on a side thereof close to the first opening 110. The lyophobic portion 130 is located between teeth of the tooth-shaped structure. The lyophobic portion 130 does not extend beyond the lyophilic portion 120 in the extending direction of the teeth. As shown in FIG. 1D, projections P1 and P2 of the side surface facing the first opening on the surface of the substrate 100 have a tooth shape, wherein the lyophilic section 120 is longer than the lyophobic section 130 in the extending direction of the teeth. In some embodiments, the tooth-shaped structure is a rectangular tooth-shaped structure. FIG. 1D shows that the side surface of the first pixel defining layer PDL1 facing the first opening 110 is rectangular tooth-shaped. In some embodiments, both the first side surface SF1 and the second side surface SF2 are rectangular. As shown in FIG. 1D, the first side face SF1 and the second side face SF2 are arranged alternately and are respectively arranged on a convex portion and a concave portion of the rectangular tooth structure.

As shown in FIG. 1D, in the rectangular tooth structure, a projection of the first side surface on the substrate P1 is approximately "CI" shaped, and a projection of the second side surface on the substrate P2 is approximately "I" shaped.

In some embodiments, a projection of the lyophobic portion 130 on the substrate is approximately rectangular, and a portion of the lyophilic portion 120, which exceeds beyond the lyophobic portion in a direction towards the first opening, is approximately rectangular.

In some other embodiments, a side surface of the first pixel defining layer PDL1 facing the first opening 110 is planar. That is, the first side surface and the second side surface are coplanar, and the projections of the first side surface and the second side surface on the surface of the substrate 100 are linear.

In the above-described embodiments, the first pixel defining layer is designed such that the side facing the first opening includes a first side surface formed by a lyophilic insulating material and a second side surface formed by a lyophobic insulating material, which can significantly improve the evenness of the thickness of the formed thin film.

Figure 2A:
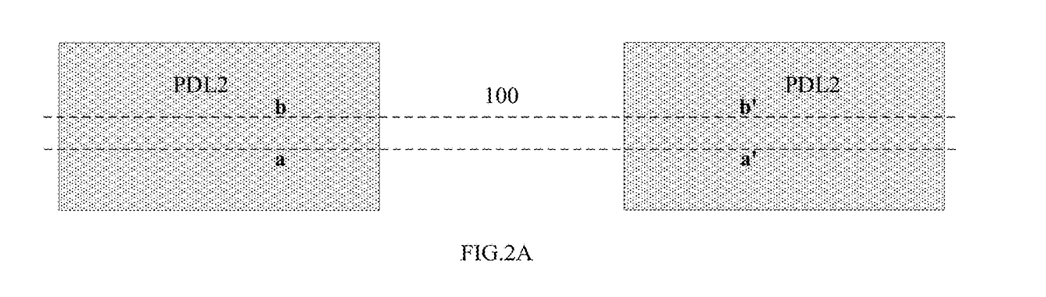
FIG. 2A is a top view illustrating a pixel defining structure according to another embodiment of this disclosure.
Figure 2B:
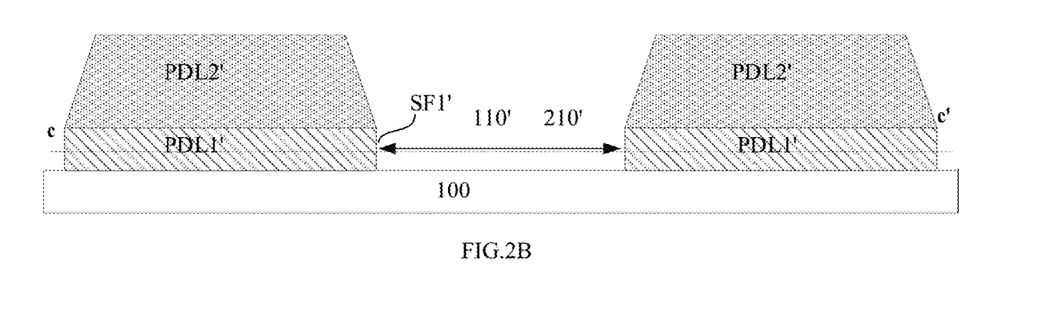
FIGS. 2B and 2C are cross-sectional views of the pixel defining structure taken along lines aa' and bb', respectively, in the top view shown in FIG. 2A.
Figure 2C:
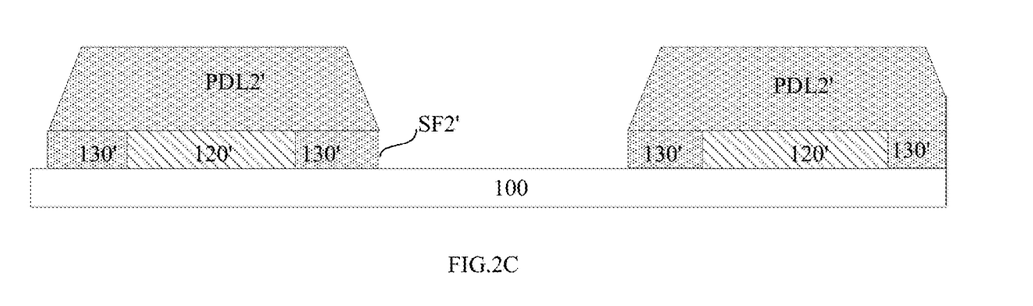
Figure 2D:
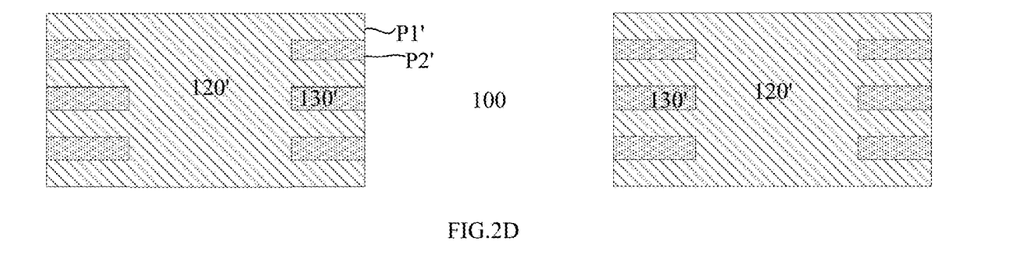
FIG. 2D is a cross-sectional view of the pixel defining structure taken along a line cc' in the cross-sectional view shown in FIG. 2B.

FIG. 2A is a top view illustrating a pixel defining structure according to another embodiment of this disclosure. FIGS. 2B and 2C are cross-sectional views of the pixel defining structure taken along lines aa' and bb' in FIG. 2A, respectively. FIG. 2D is a cross-sectional view of the pixel defining structure taken along a line cc' in FIG. 2B.

FIG. 2A illustrates a second pixel defining layer PDL2' and the substrate 100. As shown in FIG. 2B, the first pixel defining layer PDL1' has a first opening 110', and the second pixel defining layer PDL2' has the same opening as the first pixel defining layer PDL1'.

The side surface of the first pixel defining layer PDL1' facing the first opening 110' includes a first side surface SF1' and a second side surface SF2', as shown in FIGS. 2B and 2C, respectively. As shown in FIGS. 2B and 2C, the second pixel defining layer PDL2' completely covers the first pixel defining layer PDL1'. Similar to FIG. 1C, the first pixel defining layer PDL1' in FIG. 2C also includes a lyophilic portion 120' and a lyophobic portion 130', except that a volume ratio of the lyophobic portion to the lyophilic portion is larger.

FIG. 2D shows a cross-sectional view of the first pixel defining layer PDL1' taken along the line cc' in the cross-sectional view shown in FIG. 2B. As shown in FIG. 2D, projections P1 'and P2' of the first side surface SF1' and the second side surface SF2' on the surface of the substrate 100 are linear, i.e., the first side surface and the second side surface are coplanar.

In some embodiments, the first pixel defining layer and the second pixel defining layer are both mesh structures having a plurality of openings. For example, the first pixel defining layer is a mesh structure having a plurality of first openings, and all side surfaces of the first pixel defining layer facing the first openings include a first side surface formed by a first hydrophilic-hydrophobic material and a second side surface formed by a second hydrophilic-hydrophobic material. The second pixel defining layer is a mesh structure having a plurality of second openings. In some embodiments, a density of teeth of the tooth-shaped structure in the same direction is substantially the same.

A slope angle of the side surface of the first pixel defining layer facing the first opening may be in a range of 30 degrees to 90 degrees. A slope angle of the side surface of the second pixel defining layer facing the second opening is 30-90 degrees.

Figure 3A:
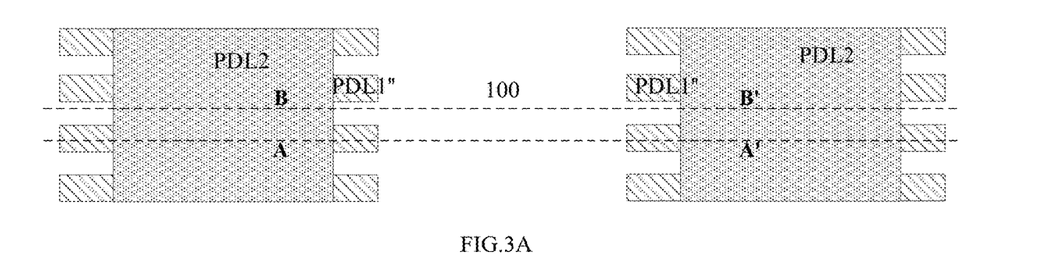
FIG. 3A is a top view illustrating a pixel defining structure according to yet another embodiment of this disclosure.
Figure 3B:
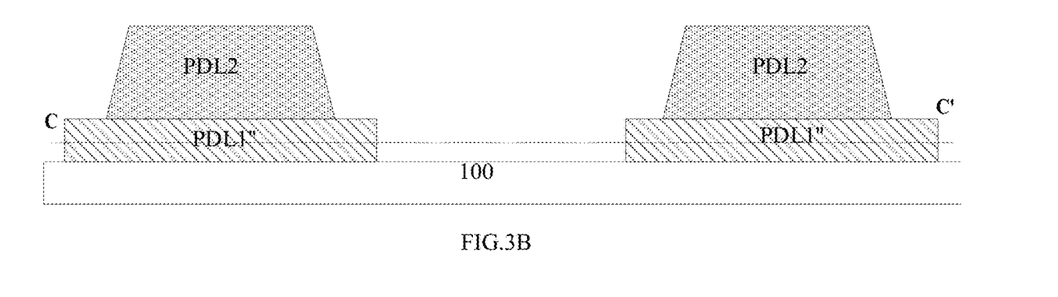
FIGS. 3B and 3C are cross-sectional views of the pixel defining structure taken along lines AA 'and BB' in FIG. 3A, respectively.
Figure 3C:
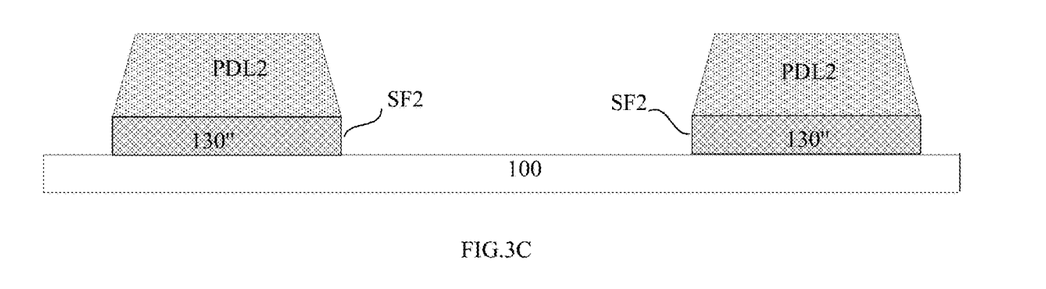
Figure 3D:
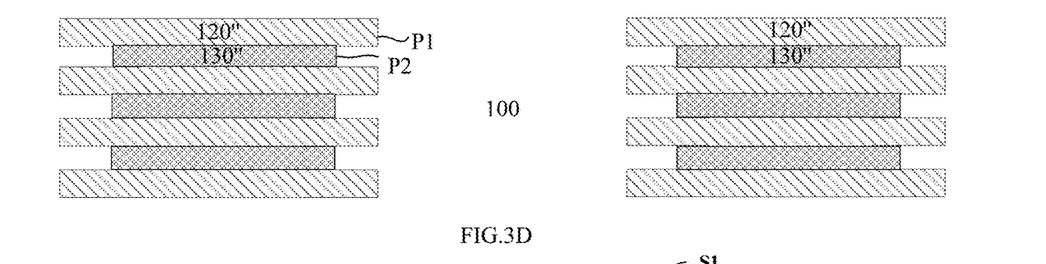
FIG. 3D is a cross-sectional view of the pixel definition structure taken along line CC' in FIG. 3B.

FIG. 3A is a top view illustrating a pixel defining structure according to yet another embodiment of this disclosure. FIG. 3A is the same as the top view shown in FIG. 1A, and therefore like structures are indicated by like reference numerals. FIGS. 3B and 3C are cross-sectional views of the pixel defining structure taken along lines AA 'and BB' in FIG. 3A, respectively. FIG. 3D is a cross-sectional view of the pixel definition structure taken along a line CC' in FIG. 3B. FIG. 3B is also the same as the cross-sectional view shown in FIG. 1B. The same parts will not be repeated here, and different FIGS. 3C and 3D will be described in detail below.

Unlike FIG. 1C, only the lyophobic portion 130" of the first pixel defining layer PDL1" can be seen from FIG. 3C, and the lyophilic portion 120" of the first pixel defining layer PDL 1" cannot be seen.

FIG. 3D is a cross-sectional view of the first pixel defining layer PDL1" taken along the line CC' in FIG. 3B. As shown in FIG. 3D, the lyophilic portion 120" and the lyophobic portion 130" are alternately arranged stripe structures, wherein the lyophilic portion 120" is longer than the lyophobic portion 130" in the extending direction of the stripe. Similarly to FIG. 1D, projections P1 and P2 of the side surface of the first pixel defining layer PDL 1" facing the first opening on the surface of the substrate 100 are also tooth-shaped.

Figure 4A:
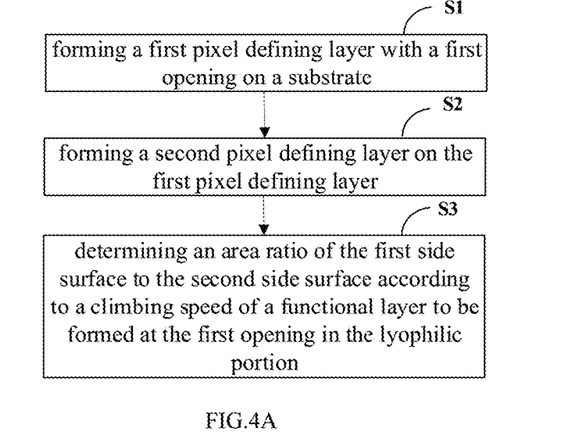
FIG. 4A is a flow chart illustrating a method of manufacturing a pixel defining structure according to an embodiment of this disclosure.

FIG. 4A is a flow chart illustrating a method of manufacturing a pixel defining structure according to one embodiment of this disclosure. Steps S1-S2 in FIG. 4A are described below in conjunction with FIGS. 1A-1D and 2A-2D.

In step S1, a first pixel defining layer with a first opening is formed on a substrate, for example, the first pixel defining layer shown in FIGS. 1D and 2D is formed. As described above, the first pixel defining layer includes a first portion and a second portion, projections of the first portion and the second portion on the surface of the substrate are substantially not overlapped, and a side surface of the first pixel defining layer facing the first opening includes a first side surface formed by a first hydrophilic-hydrophobic material and a second side surface formed by a second hydrophilic-hydrophobic material, wherein the first hydrophilic-hydrophobic material has different hydrophilicity and hydrophobicity from that of the second hydrophilic-hydrophobic material. The first opening is used for forming a functional layer therein.

In step S2, a second pixel defining layer is formed on the first pixel defining layer, for example, the structure shown in FIGS. 1A-1C and 2A-2C is formed. As described above, the second pixel defining layer has a second opening. The projection of the second pixel defining layer on the surface of the substrate is completely covered by the projection of the first pixel defining layer on the surface of the substrate. The second opening is located correspondingly to the first opening, and the projection of the second opening on the surface of the substrate completely covers the projection of the first opening on the surface of the substrate.

In some embodiments, the method of manufacturing a pixel defining structure further comprises: a step S3 of determining an area ratio of the first side surface to the second side surface according to a climbing speed of the functional layer to be formed at the first opening in the first portion (i.e., the lyophilic portion). Step S3 will be described later in conjunction with FIG. 5.

Figure 4B:
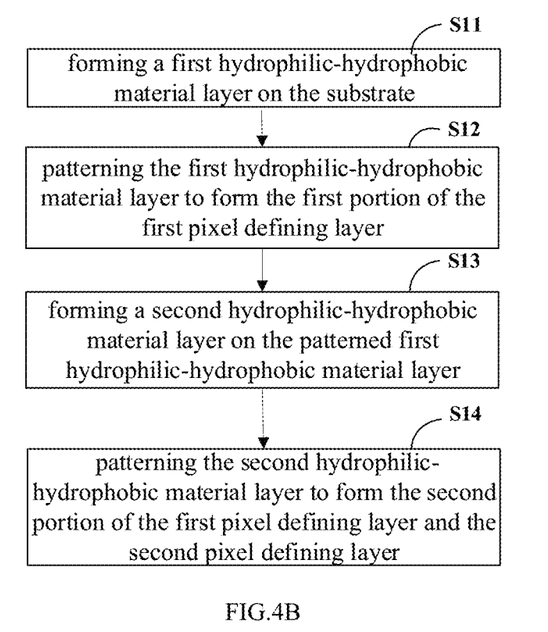
FIG. 4B is a flow chart illustrating a method of manufacturing a pixel defining structure according to another embodiment of this disclosure.
Figure 6:
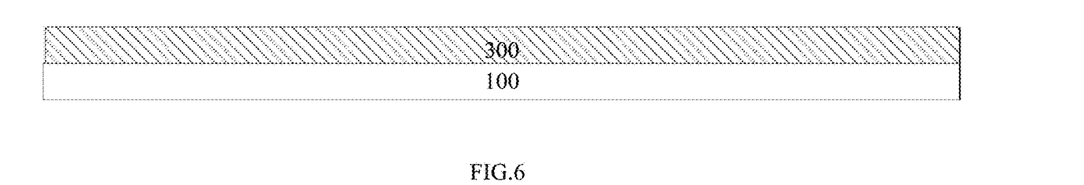
FIG. 6 is a cross-sectional view of the pixel defining structure after forming a first hydrophilic-hydrophobic material layer according to an embodiment of this disclosure.
Figure 7A:
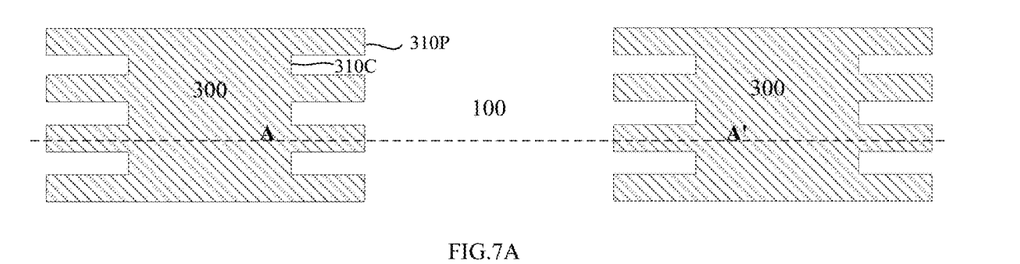
FIG. 7A is a top view illustrating of the pixel defining structure after patterning the first hydrophilic-hydrophobic material layer according to one embodiment of this disclosure.
Figure 7B:
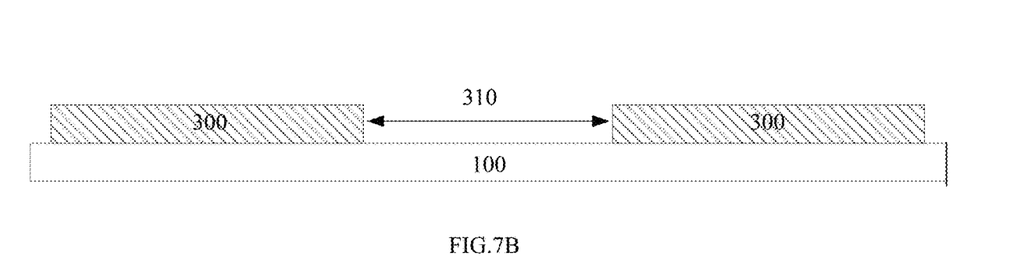
FIG. 7B is a cross-sectional view of the pixel defining structure taken along a line AA' in FIG. 7A.
Figure 8:
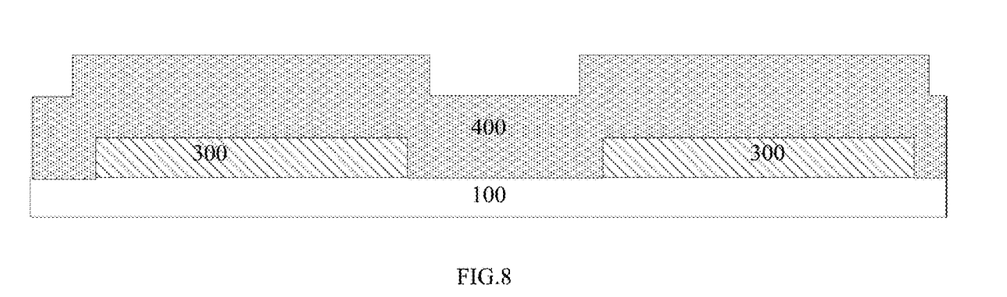
FIG. 8 is a cross-sectional view after forming the second hydrophilic-hydrophobic material layer according to one embodiment of this disclosure.

FIG. 4B is a flowchart illustrating a method of manufacturing a pixel defining structure according to another embodiment of this disclosure. Steps S11-S14 in FIG. 4B are described below in conjunction with FIGS. 6-8. FIG. 6 shows a cross-sectional view of the pixel defining structure after forming a first hydrophilic-hydrophobic material layer according to an embodiment of this disclosure. FIG. 7A is a top view of the pixel defining structure illustrating after patterning the first hydrophilic-hydrophobic material layer according to an embodiment of this disclosure; FIG. 7B is a cross-sectional view of the pixel defining structure taken along line AA' in FIG. 7A. FIG. 8 is a cross-sectional view after forming a second hydrophilic-hydrophobic material layer according to an embodiment of this disclosure.

In step S11, a first hydrophilic-hydrophobic material layer 300 is formed on the substrate 100, forming the structure shown in FIG. 6. In some embodiments, the first hydrophilic-hydrophobic material layer is formed by a spin coating or evaporation process. As described above, the first hydrophilic-hydrophobic material layer may comprise $SiO_2$.

In a step S12, the first hydrophilic-hydrophobic material layer 300 is patterned to form a first portion (e.g., a lyophilic portion) of the first pixel definition layer, for example, the structure shown in FIGS. 7A and 7B is formed. The side surface of the patterned first hydrophilic-hydrophobic material layer 300 close to the opening 310 comprises a tooth-shaped structure. As shown in FIG. 7A, the projection of the side surface of the first hydrophilic-hydrophobic material layer 300 facing the opening 310 on the substrate 100 is tooth-shaped. That is, the side surface of the first hydrophilic-hydrophobic material layer facing the opening is a surface in which protrusions 310P and depressions 310C are alternately arranged. In some embodiments, the patterning process includes a photolithography process, for example, exposing and developing the first hydrophilic-hydrophobic material layer by using a mask to form a tooth-shaped first hydrophilic-hydrophobic material layer.

In a step S13, a second hydrophilic-hydrophobic material layer 400 is formed on the basis of the patterned first hydrophilic and hydrophobic material layer 300, to form a structure as shown in FIG. 8, for example. As shown in FIG. 8, a portion of the second hydrophilic-hydrophobic material layer 400 fills the opening 310, and the other portion thereof covers the first hydrophilic-hydrophobic material layer 300 (i.e., the lyophilic portion of the first pixel defining layer). In some embodiments, the second hydrophilic-hydrophobic material layer is formed by a spin coating or evaporation process. As described above, the second hydrophilic-hydrophobic material layer may comprise a fluorolipid material.

In step S14, the second hydrophilic-hydrophobic material layer 400 is patterned to form a first opening and a second opening at corresponding positions of the opening 310, thereby forming a first pixel defining layer with the first opening and a second pixel defining layer with the second opening, for example, to form the structure shown in FIG. 1B or 2B. In FIGS. 1B and 2B, the projection of the second opening on the surface of the substrate completely covers the projection of the first opening on the surface of the substrate. Specifically, FIG. 1B shows that the second opening is larger than the first opening; and FIG. 2B shows that the second opening is substantially the same size as the first opening. As described above, the side surface of the first pixel defining layer facing the first opening comprises a first side surface formed by the first hydrophilic-hydrophobic material and a second side surface formed by the second hydrophilic-hydrophobic material.

In the step S14, a patterning process similar to that in the step S12 may be employed, for example, exposing and developing the second hydrophilic-hydrophobic material using a mask, except that a different mask from that in the step S12 is employed. Different masks may be used to form different first and second openings, so that different first and second pixel defining layers may be formed.

In some embodiments, a kind of mask is used to form the first pixel defining layer PDL1 and the second pixel defining layer PDL2 as shown in FIGS. 1A-1D, wherein the second opening 210 is larger than the first opening 110, and the second pixel defining layer PDL2 partially covers the first pixel defining layer PDL1.

In some other embodiments, another kind of mask is used to form the first pixel defining layer PDL1' and the second pixel defining layer PDL2' as shown in FIGS. 2A-2D, wherein the second opening 210' is equal to the first opening 110', and the second pixel defining layer PDL2' completely covers the first pixel defining layer PDL1'.

According to the embodiments of this disclosure, there is further provided a display panel comprising the pixel defining structure and a method of manufacturing the same.

Figure 5:
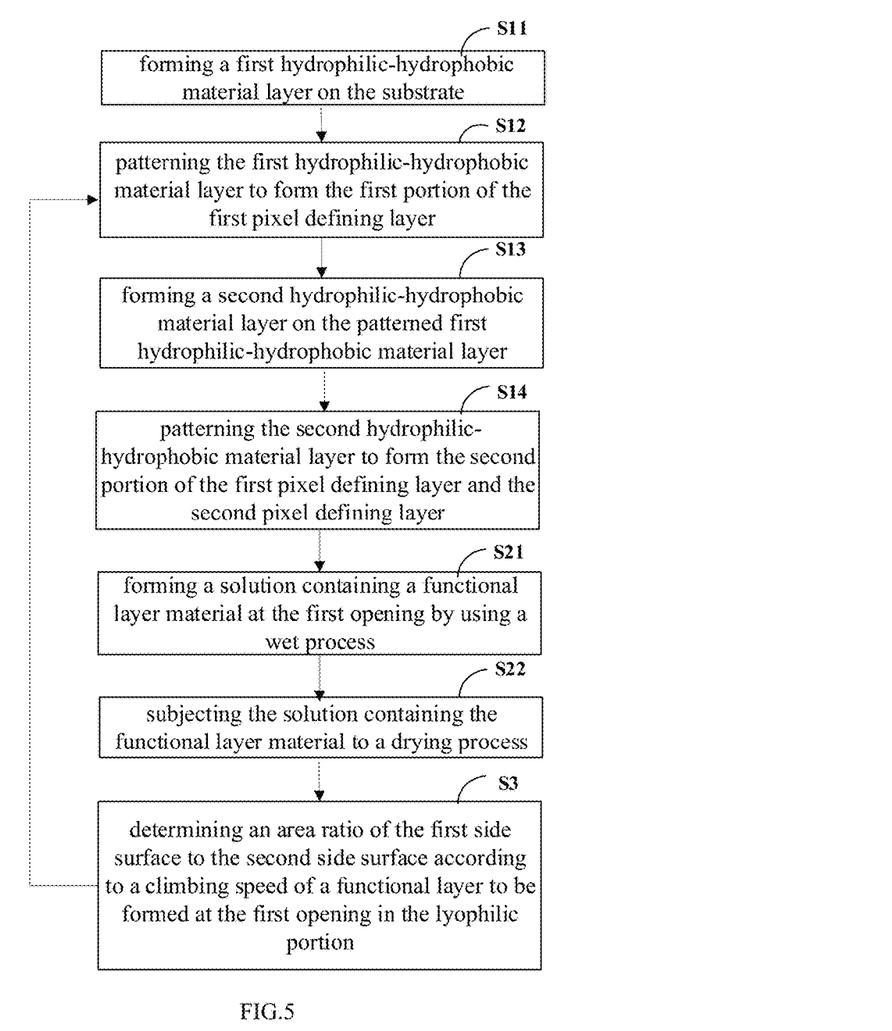
FIG. 5 is a flow chart illustrating a method of manufacturing a display panel according to an embodiment of this disclosure.

FIG. 5 is a flow chart illustrating a method of manufacturing a display panel according to another embodiment of this disclosure. Steps S11, S12, S13, S14 in FIG. 5 are similar to the corresponding steps in FIG. 4B, and thus a description thereof will not be repeated below, and only steps S21, S22, and S3 will be described in detail.

In step S21, a solution containing a functional layer material is formed in the opening by using a wet process, and the pixel defining structure outlines the opening for forming the functional layer, the opening including a first opening. In some embodiments, the wet process comprises an inkjet printing process. When a solution containing a functional layer material is formed by using inkjet printing, ink may be formed by dissolving the corresponding functional layer material as a solute in an aromatic solvent.

The functional layer is, for example, a light-emitting layer, a hole injection layer, a hole transport layer, or an electron blocking layer. As an example, the following materials may be selected for each of the functional layers. For example, the material of the light-emitting layer may be selected from, for example, poly (p-styrene), polythiophene, polyfluorene, and the like. The material of the hole transport layer can be selected from PEDOT/PSS (doped polyaniline). The material of the electron blocking layer can be selected from Ir (ppz) 3 (Tris (phenylpyrazole) iridium; Tris (1-ylpyrazole) iridium).

In step S22, the solution containing the functional layer material is subjected to a drying process. In some embodiments, the solution is subjected to a drying process such as a vacuum process, in a vacuum chamber. After the drying processes are performed on different functional layer materials by adopting different parameters (e.g., temperature, time, vacuum degree and the like), the corresponding functional layer can be obtained at the position corresponding to the first opening. The thickness evenness of these functional layers as a component of the pixel will significantly affect the display effect. Each pixel cell is located in one first opening.

Figure 9A:
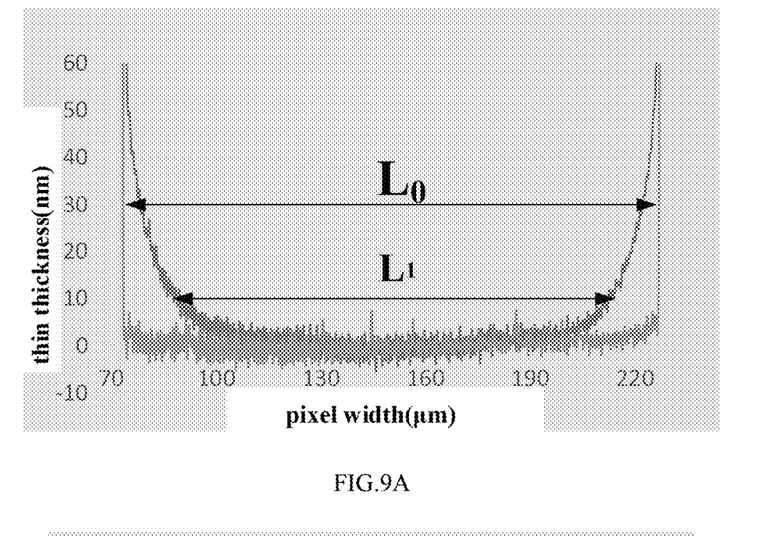
FIGS. 9A and 9B show thickness distribution of functional layers in one pixel cell in a longitudinal direction L and a transverse direction T, respectively.
Figure 9B:
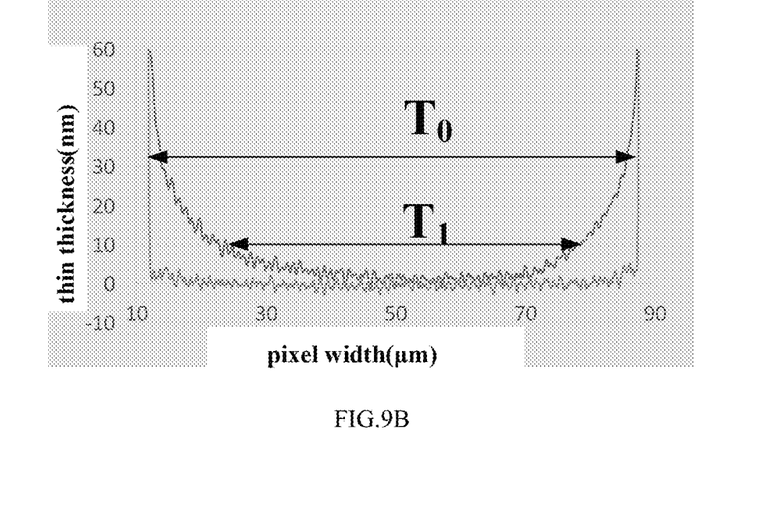

After obtaining the corresponding functional layer, a thickness of the functional layer in different directions can be measured. FIGS. 9A and 9B show the thickness distribution of the functional layer in one pixel cell in the longitudinal direction L and the transverse direction T, respectively, wherein the horizontal axis represents a width of the pixel cell (i.e., pixel width) and the vertical axis represents a thickness of the functional layer (i.e., film thickness). The first pixel defining layer employed in FIGS. 9A, 9B is composed of only a hydrophilic material.

According to the light emitting principle of a light emitting device such as an OLED, it is desirable that the functional layer has an even thickness over the entire range of the pixel width, which is equal to the design thickness. That is, it is desirable that: the width corresponding to the functional layer whose actual thickness is within the design tolerance range (also referred to as actual width) is as large as possible as the design width, wherein the design tolerance means that a difference between the actual thickness and the design thickness is tolerable within a certain range. A functional layer whose actual thickness is within the design tolerance range is considered flat and can be used to calculate the actual width.

FIGS. 9A and 9B show the design widths $L_0$ and $T_0$, and the actual widths $L_1$ and $T_1$ of the pixels in the longitudinal direction L and the transverse direction T, respectively, with a design tolerance of 10 nm. From the data of FIGS. 9A and 9B, it can be calculated that $L_1/L_0=82\%$, $T_1/T_0=73\%$. Such results show that, the thickness evenness in the longitudinal direction L and the transverse direction T is low, and the thickness evenness in the transverse direction T is lower than that in the longitudinal direction L, i.e., $T_1/T_0<L_1/L_0$.

In the foregoing embodiment, by designing the first pixel defining layer so that the side surface facing the first opening includes the first side surface formed by the first hydrophilic-hydrophobic material and the second side surface formed by the second hydrophilic-hydrophobic material, the evenness of the thickness of the formed thin film can be significantly improved, for example, $L_1/L_0\approx90\%$, $T_1/T_0\approx85\%$, and the thickness evenness in the longitudinal direction L and the transverse direction T can be made close, i.e., $L_1/L_0$ is closer to $T_1/T_0$.

In some other embodiments, the thickness evenness of the functional layer can be further improved by adjusting the area ratio of the first side surface to the second side surface. The thickness evenness of the obtained functional layer can reflect the climbing speed of the functional layer to be formed at the opening in the lyophilic portion. Thereby, the area ratio of the first side surface to the second side surface can be determined in step S3 according to the climbing speed of the functional layer to be formed at the opening in the lyophilic portion.

For example, if the measured result is $T_1/T_0<L_1/L_0$, i.e., the thickness evenness in the transverse direction T is lower than the thickness evenness in the longitudinal direction L, the area ratio of the first surface of the first pixel defining layer facing the first opening to the second surface thereof in the transverse direction T may be reduced, so that the surface tension of the solution is redistributed during the drying process, thereby enabling the solute migration function in the longitudinal and transverse directions to be uniform as much as possible to reach $T_1/T_0=L_1/L_0$. In this case, the area of the first surface may be reduced or the area of the second surface may be increased, or both the area of the first surface is reduced and the area of the second surface is increased.

Taking rectangular tooth-shaped first and second side surfaces of FIGS. 1A-1D as an example, the width of the rectangular teeth can be reduced without changing the shape of the opening, so that the area of the first side surface at the top of the rectangular teeth will be reduced, and the area of the second side surface at the root of the rectangular teeth will be correspondingly increased. In addition, the rectangular tooth-shaped first pixel defining layer will drain the solution, which helps to further control the morphology of the functional layer.

Similarly, if the measured result is $T_1/T_0>L_1/L_0$, that is, the thickness evenness in the transverse direction T is greater than the thickness evenness in the longitudinal direction L, it can reach $T_1/T_0=L_1/L_0$ as much as possible by reducing the area ratio of the first surface of the first pixel defining layer facing the first opening to the second surface thereof in the longitudinal direction L.

According to some embodiments of this disclosure, the area ratio of the first side surface to the second side surface is inversely proportional to the climbing speed. That is, the faster the climbing speed of the functional layer material in the lyophilic portion of the first pixel defining layer in a certain direction, the smaller the area ratio of the first side surface to the second side surface in that direction is to be adjusted. By reducing the area ratio of the first surface of the first pixel defining layer facing the first opening to the second surface thereof in the longitudinal direction L or the transverse direction T, the climbing of the functional layer material on the side surface of the first pixel defining layer can be reduced, thereby further increasing $L_1/L_0$ or $T_1/T_0$, for example, to reach $L_1/L_0\approx T_1/T_0\approx90\%$.

Figure 10A:
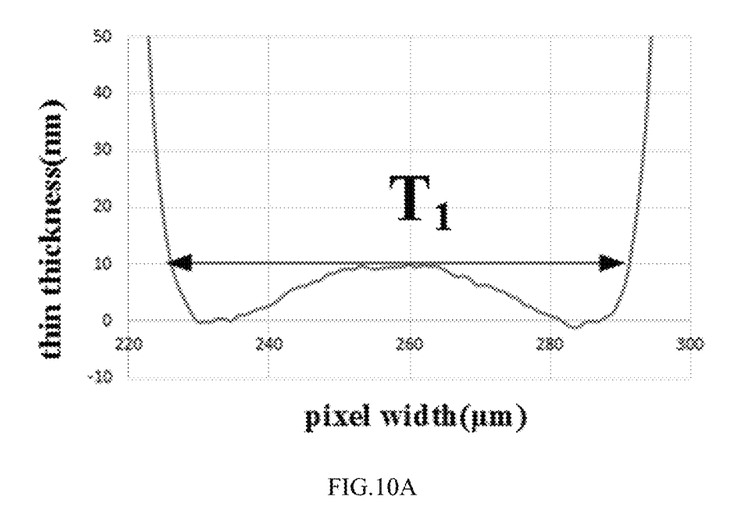
FIGS. 10A and 10B show thickness distribution of functional layers in a pixel cell in the longitudinal direction L and the transverse direction T, respectively, according to some embodiments of this disclosure.
Figure 10B:
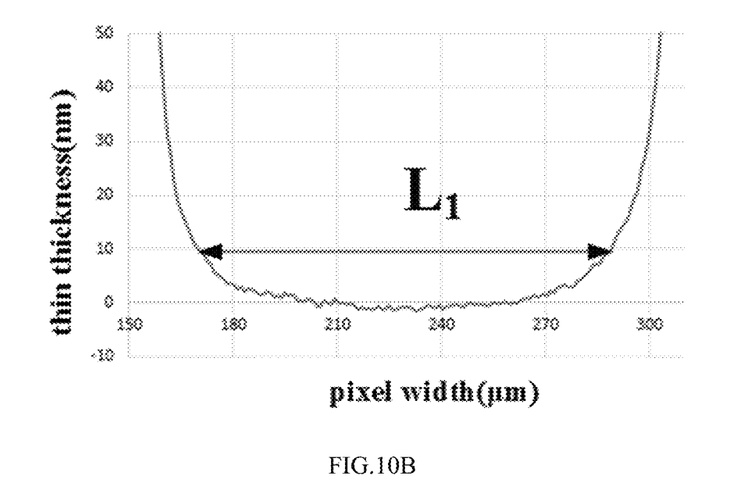

FIGS. 10A, 10B show the thickness distribution of the functional layers in a pixel cell in the transverse direction T and the longitudinal direction L, respectively, according to some embodiments of this disclosure. From the data of FIGS. 10A, 10B, again taking the design tolerance of 10 nm as an example, the actual widths in the longitudinal direction L and the transverse direction T are $L_1\approx115$ μm and $T_1\approx70$ μm, respectively.

It can also be seen by comparing FIGS. 10A and 10B that: in the longitudinal direction L, the functional layer material is obviously climbed on the side surface of the first pixel defining layer; while in the transverse direction T, the functional layer material is significantly deposited in the middle region of the pixel cell.

Specifically, the lyophilic material on the first side surface plays a more important role than the lyophobic material on the second side surface in the longitudinal direction L, i.e., an attraction effect to the solute is greater than an repulsion effect on both sides of the pixel unit (the side surface of the first pixel defining layer), causing the solute to climb on the side surface. In contrast, in the transverse direction T, the lyophobic material on the second side surface plays a more important role than the lyophilic material on the first side surface, i.e. the repulsion effect to the solute is greater than the attraction effect on both sides of the pixel unit, causing the solute to be repelled by the side surface and thus be deposited in the middle region away from the side surface.

Such results show that: the solute migration function of the functional layer material are not uniform in the longitudinal direction L and the transverse direction T. In this case, the thickness evenness of the functional layer in the longitudinal direction L and the transverse direction T may be determined according to the design widths $L_0$ and $T_0$ of the pixels in the longitudinal direction L and the transverse direction T, thereby determining the solute migration in which direction needs to be adjusted so that the solute migration functions in different directions are uniform.

For example, if $L_0 \approx 135$ μm and $T_0 \approx 80$ μm, then it can be calculated that $L_0/L_0 \approx 85\%$ and $T_1/T_0 \approx 87.5\%$. That is, the thickness evenness in the transverse direction T is larger than the thickness evenness in the longitudinal direction L, and $T_1/T_0 > L_1/L_0$. Therefore, the solute migration function in the longitudinal direction L can be adjusted, for example, reducing the attraction effect to the lyophilic material in the longitudinal direction L and increasing the repulsion effect to the lyophobic material. That is, the area ratio of the first surface of the first pixel defining layer facing the first opening to the second surface thereof in the longitudinal direction L may be reduced to reach $T_1/T_0 = L_1/L_0$ as much as possible, and the solute migration function in the longitudinal direction L tends to consistent with the solute migration function in the transverse direction T.

In contrast, if $L_0 \approx 128$ μm and $T_0 \approx 80$ μm, it can be calculated that $L_1/L_0 \approx 90\%$ and $T_1/T_0 \approx 87.5\%$. That is, the thickness evenness in the transverse direction T is lower than that in the longitudinal direction L, $T_1/T_0 < L_1/L_0$. Thus, the solute migration function in the transverse direction T can be adjusted, for example, reducing the repulsion effect to the lyophobic material in the transverse direction T and increasing the attraction effect to the lyophilic material. The area ratio of the first surface of the first pixel defining layer facing the first opening to the second surface thereof in the transverse direction T may be increased to redistribute the surface tension of the solution during the drying process, so that the solute migration function in the transverse direction T is consistent with that in the longitudinal direction L, to reach $T_1/T_0 = L_1/L_0$ as much as possible.

Determining the area ratio of the first surface to the second surface also requires the consideration of a number of factors such as the composition of the solution, the material of the first pixel defining layer, and the slope angle of the side surface. In some embodiments, the slope angle of the side surface of the first pixel defining layer facing the first opening is in a range of 30 degrees to 90 degrees.

In the pixel defining structure in which a side of the lyophilic portion of the first pixel defining layer PDL1 close to the first opening includes a tooth-shaped structure, the area ratio of the first surface to the second surface can also be reflected by a size of the teeth. The size of the teeth may be determined according to the resolution of the formed display panel. The resolution of the display panel decides the pixel size (i.e., the size of the first opening) and the pitch, i.e., the structure of the pixel defining layer, e.g., the size of the pixel defining unit (i.e., PDL1). How the size of the teeth is determined is described below by using a long side as an example. For example, assuming that the pixel pitch is P and the long side size of the pixel is Dp, the size of the pixel defining unit PDL1 is $D_1 = P - D_p$. Assuming that the minimum size of PDL2, which ensures no overflow, is $D_2$ and the slope angles of PDL1 and PDL2 facing the opening are both 90 degrees when the solution containing the functional layer material is formed by a wet process, the maximum size of the teeth is $(D_1 - D_2)/2$.

For example, for a display panel with a maximum resolution of 160 ppi (pixels per inch pixel), by taking the long side as an example, assuming that the pixel size and pitch are 120 μm and 160 μm, respectively, the unit size of PDL1 is 40 Assuming that the minimum size of PDL2, which ensures no overflow, is 20 μm and the slope angles of PDL1 and PDL2 facing the opening are both 90 degrees when the solution containing the functional layer material is formed by using inkjet printing, the maximum size of the teeth is $(40-20)/2=10$ μm.

The adjustable size range of the teeth (i.e., the range from zero to the maximum size) in the pixel defining layer PDL1 may be different for different resolutions. The higher the resolution, the greater the adjustable size range of the teeth.

It can also be seen from the above that the adjustable size range of the teeth in PDL1 also depends on the magnitude of the slope angles of PDL1 and PDL2 facing the opening. In addition, for different wet processes for preparing the functional layer material, the minimum size of PDL2 which ensures no overflow is also different. That is, the adjustable size range of the teeth in PDL1 also depends on the wet process employed.

According to an embodiment of this disclosure, there is also provided a display device including the aforementioned display panel. In some embodiments, the display device may be: any product or component with a display function such as mobile phone, tablet computer, television, display, notebook computer, digital photo frame, navigator and the like.

To this end, various embodiments of this disclosure have been described in detail. Some details that are well known in the art are omitted in order to avoid obscuring the concepts of this disclosure. Those skilled in the art can fully understand how to implement the technical solutions disclosed herein based on the above description.

While certain specific embodiments of this disclosure have been described in detail by way of example, it should be understood by those skilled in the art that the above examples are illustrative only and are not intended to limit the scope of this disclosure. It will be understood by those skilled in the art that modifications may be made to the above embodiments or equivalents may be substituted for some technical feature without departing from the scope and spirit of this disclosure. The scope of this disclosure is defined by the appended claims.

What is claimed is:

1. A pixel defining structure, comprising:
a first pixel defining layer with a first opening, located on a substrate, wherein the first pixel defining layer comprises a first portion formed by a first hydrophilic-hydrophobic material and a second portion formed by a second hydrophilic-hydrophobic material, projections of the first portion and the second portion on a surface of the substrate are substantially not overlapped, a side surface of the first pixel defining layer facing the first opening comprises a first side surface formed by the first hydrophilic-hydrophobic material and a second side surface formed by the second hydrophilic-hydrophobic material, and the first hydrophilic-hydrophobic material and the second hydrophilic-hydrophobic material are of different hydrophilicity-hydrophobicity.

2. The pixel defining structure according to claim 1, wherein the first portion is a lyophilic portion, the second portion is a lyophobic portion, a side of the lyophilic portion close to the first opening comprises a tooth-shaped structure, the lyophobic portion is located between teeth of the tooth-shaped structure, and the lyophobic portion does not extend beyond the lyophilic portion in an extending direction of the teeth.

3. The pixel defining structure according to claim 2, wherein the tooth-shaped structure is a rectangular tooth-shaped structure, and in the rectangular tooth structure, a projection of the first side surface on the substrate is approximately "∩" shaped, and a projection of the second side surface on the substrate is approximately "|" shaped.

4. The pixel defining structure according to claim 1, further comprising:
a second pixel defining layer with a second opening, located on a side of the first pixel defining layer away from the substrate, wherein the second pixel defining layer is formed by the second hydrophilic-hydrophobic material, a projection of the second pixel defining layer on the surface of the substrate is completely covered by the projection of the first pixel defining layer on the surface of the substrate, the second opening is located correspondingly to the first opening, and a projection of the second opening on the surface of the substrate completely covers a projection of the first opening on the surface of the substrate.

5. The pixel defining structure according to claim 1, wherein the first hydrophilic-hydrophobic material comprises $SiO_2$.

6. The pixel defining structure according to claim 1, wherein the second hydrophilic-hydrophobic material comprises a fluorolipid material.

7. The pixel defining structure according to claim 4, wherein the first pixel defining layer comprises a main body portion and a tooth-shaped structure, and a projection of the second pixel defining layer on the substrate completely falls into the projection of the main body portion of the first pixel defining layer.

8. The pixel defining structure according to claim 1, wherein the first pixel defining layer is a mesh structure having a plurality of first openings, and all side surfaces of the first pixel defining layer facing the plurality of first openings include the first side surface formed by the first hydrophilic-hydrophobic material and the second side surface formed by the second hydrophilic-hydrophobic material.

9. The pixel defining structure according to claim 1, wherein the first portion and the second portion in the first pixel defining layer have the same height.

10. The pixel defining structure according to claim 4, wherein the second hydrophilic-hydrophobic material in the second portion of the first pixel defining layer and in the second pixel defining layer are integral, and the second hydrophilic-hydrophobic material is a lyophobic material.

11. The pixel defining structure according to claim 4, wherein:
a slope angle of the side surface facing the first opening is in a range of 30 degrees to 90 degrees; and/or
a slope angle of the side surface of the second pixel defining layer facing the second opening is in a range of 30 degrees to 90 degrees.

12. A display panel comprising the pixel defining structure according to claim 1.

13. The pixel defining structure according to claim 2, wherein the first side surface and the second side surface are arranged alternately and are respectively arranged on a convex portion and a concave portion of the rectangular tooth structure.

14. The pixel defining structure according to claim 2, wherein a projection of the lyophobic portion on the substrate is approximately rectangular, and a portion of the lyophilic portion, which exceeds beyond the lyophobic portion in a direction towards the first opening, is approximately rectangular.

15. The pixel defining structure according to claim 8, wherein the first pixel defining layer comprises a main body portion and a tooth-shaped structure, and a density of teeth of the tooth-shaped structure in the same direction is substantially the same.

16. A method of manufacturing a pixel defining structure, comprising:
forming a first pixel defining layer with a first opening on a substrate, wherein the first pixel defining layer comprises a first portion formed by a first hydrophilic-hydrophobic material and a second portion formed by a second hydrophilic-hydrophobic material, projections of the first portion and the second portion on a surface of the substrate are substantially not overlapped, a side surface of the first pixel defining layer facing the first opening comprises a first side surface formed by the first hydrophilic-hydrophobic material and a second side surface formed by the second hydrophilic-hydrophobic material, and the first hydrophilic-hydrophobic material and the second hydrophilic-hydrophobic material are of different hydrophilicity-hydrophobicity.

17. The method according to claim 16, further comprises: forming a second pixel defining layer on the first pixel defining layer, wherein forming the first pixel defining layer and the second pixel defining layer comprises:
forming a first hydrophilic-hydrophobic material layer on the substrate;
patterning the first hydrophilic-hydrophobic material layer to form the first portion of the first pixel defining layer;
forming a second hydrophilic-hydrophobic material layer on a basis of the patterned first hydrophilic-hydrophobic material layer;
patterning the second hydrophilic-hydrophobic material layer to form the second portion of the first pixel defining layer and the second pixel defining layer, wherein the second pixel defining layer has a second opening, a projection of the second pixel defining layer on the surface of the substrate is completely covered by a projection of the first pixel defining layer on the surface of the substrate, the second opening is located corresponding to the first opening, and a projection of the second opening on the surface of the substrate completely covers a projection of the first opening on the surface of the substrate.

18. The method according to claim 16, wherein the first portion is a lyophilic portion, the method further comprising:
determining an area ratio of the first side surface to the second side surface according to a climbing speed of a functional layer to be formed at the first opening in the lyophilic portion.

19. The method according to claim 18, wherein the area ratio of the first side surface to the second side surface is inversely proportional to the climbing speed.

20. A method of manufacturing a display panel, comprising:
 the method of manufacturing the pixel defining structure according to claim 16, wherein the pixel defining structure outlines an opening for forming the functional layer, the opening comprising the first opening;
 forming a solution containing a material of the functional layer in the opening by using inkjet printing.

* * * * *